United States Patent
Chung et al.

(10) Patent No.: US 7,518,927 B2
(45) Date of Patent: Apr. 14, 2009

(54) NON-VOLATILE SEMICONDUCTOR MEMORY DEVICE AND METHOD FOR RECOVERING DATA IN NON-VOLATILE SEMICONDUCTOR MEMORY DEVICE

(75) Inventors: Tae-Jin Chung, Seoul (KR); Jeong-Un Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 11/606,228

(22) Filed: Nov. 30, 2006

(65) Prior Publication Data

US 2008/0094897 A1    Apr. 24, 2008

(30) Foreign Application Priority Data

Oct. 23, 2006    (KR) ...................... 10-2006-0102805

(51) Int. Cl.
*G11C 16/06* (2006.01)

(52) U.S. Cl. ............... 365/185.2; 365/154; 365/185.09; 365/185.21; 365/185.28

(58) Field of Classification Search ................. 365/154, 365/185.09, 185.2, 185.21, 185.28
See application file for complete search history.

(56) References Cited

U.S. PATENT DOCUMENTS

| | | | |
|---|---|---|---|
| 6,678,192 B2 | 1/2004 | Gongwer | |
| 2004/0237010 A1 | 11/2004 | Auclair | |
| 2005/0083726 A1* | 4/2005 | Auclair et al. | ............... 365/154 |
| 2006/0075320 A1 | 4/2006 | Gendrier | |
| 2006/0136676 A1* | 6/2006 | Park et al. | ................... 711/144 |

* cited by examiner

*Primary Examiner*—Hoai V Ho
(74) *Attorney, Agent, or Firm*—Harness, Dickey & Pierce (57) ABSTRACT

A method and device for recovering data in a non-volatile semiconductor memory device that may include controlling a reference current by the non-volatile semiconductor memory device, reading data of at least one memory cell based on the controlled reference current, storing the read data in a buffer memory, and writing the data stored in the buffer memory to the at least one memory cell.

18 Claims, 6 Drawing Sheets

FIG. 1

CONVENTIONAL ART

|   | 0 | 1 | 2 | 3 | 4 | 5 | 6 | 7 |
|---|---|---|---|---|---|---|---|---|
| 0 | 100 | 0 | 100 | 0 | 100 | 0 | 100 | 0 |
| 1 | 0 | 100 | 0 | 100 | 0 | 100 | 0 | 100 |
| 2 | 100 | 0 | 100 | 0 | 100 | 0 | 100 | 0 |
| 3 | 0 | 100 | 0 | 100 | 0 | 100 | 0 | 100 |
| 4 | 100 | 0 | 100 | 0 | 100 | 0 | 100 | 0 |
| 5 | 0 | 100 | 0 | 100 | 0 | 100 | 0 | 100 |
| 6 | 100 | 0 | 100 | 0 | 100 | 0 | 100 | 0 |
| 7 | 0 | 100 | 0 | 100 | 0 | 100 | 0 | 100 |

—110

| X | 100 | 100 | 100 | 100 | 100 | 100 | 100 | 100 |

|   | 0 | 1 | 2 | 3 | 4 | 5 | 6 | 7 |
|---|---|---|---|---|---|---|---|---|
| 0 | 100 | 0 | 100 | 0 | 100 | 0 | 100 | 0 |
| 1 | 0 | 100 | 0 | 100 | 0 | 100 | 0 | 100 |
| 2 | 100 | 0 | 100 | 0 | 100 | 0 | 100 | 0 |
| 3 | 0 | 100 | 0 | 100 | 0 | 100 | 0 | 100 |
| 4 | 100 | 0 | 100 | 0 | 40 | 0 | 100 | 0 |
| 5 | 0 | 100 | 0 | 100 | 0 | 100 | 0 | 100 |
| 6 | 100 | 0 | 100 | 0 | 100 | 0 | 100 | 0 |
| 7 | 0 | 100 | 0 | 100 | 0 | 100 | 0 | 100 |

—110, —111

| X | 100 | 100 | 100 | 100 | 100 | 100 | 100 | 100 |

| | 0 | 1 | 2 | 3 | 4 | 5 | 6 | 7 | |
|---|---|---|---|---|---|---|---|---|---|
| 0 | 100 | 0 | 100 | 0 | 100 | 0 | 100 | 0 | 110 |
| 1 | 0 | 100 | 0 | 100 | 0 | 100 | 0 | 100 | |
| 2 | 100 | 0 | 100 | 0 | 100 | 0 | 100 | 0 | |
| 3 | 0 | 100 | 0 | 100 | 0 | 100 | 0 | 100 | |
| 4 | 100 | 0 | 100 | 0 | 40 | 0 | 100 | 0 | 111 |
| 5 | 0 | 100 | 0 | 100 | 0 | 100 | 0 | 100 | |
| 6 | 100 | 0 | 100 | 0 | 100 | 0 | 100 | 0 | |
| 7 | 0 | 100 | 0 | 100 | 0 | 100 | 0 | 100 | |
| X | 100 | 0 | 100 | 0 | 100 | 0 | 100 | 0 | 150 |

FIG. 8

| | 0 | 1 | 2 | 3 | 4 | 5 | 6 | 7 | |
|---|---|---|---|---|---|---|---|---|---|
| 0 | 100 | 0 | 100 | 0 | 100 | 0 | 100 | 0 | 110 |
| 1 | 0 | 100 | 0 | 100 | 0 | 100 | 0 | 100 | |
| 2 | 100 | 0 | 100 | 0 | 100 | 0 | 100 | 0 | |
| 3 | 0 | 100 | 0 | 100 | 0 | 100 | 0 | 100 | |
| 4 | 100 | 0 | 100 | 0 | 100 | 0 | 100 | 0 | 111 |
| 5 | 0 | 100 | 0 | 100 | 0 | 100 | 0 | 100 | |
| 6 | 100 | 0 | 100 | 0 | 100 | 0 | 100 | 0 | |
| 7 | 0 | 100 | 0 | 100 | 0 | 100 | 0 | 100 | |
| X | 100 | 0 | 100 | 0 | 100 | 0 | 100 | 0 | 150 |

FIG. 9

NON-VOLATILE SEMICONDUCTOR MEMORY DEVICE AND METHOD FOR RECOVERING DATA IN NON-VOLATILE SEMICONDUCTOR MEMORY DEVICE

PRIORITY STATEMENT

This application claims the benefit of Korean Patent Application No. 10-2006-0102805, filed on Oct. 23, 2006, in the Korean Intellectual Property Office, the disclosure of which is incorporated herein in its entirety by reference.

BACKGROUND

1. Field

Example embodiments relate to a semiconductor memory device, for example, to a non-volatile semiconductor memory device which may recover data when an error is generated in the data of the non-volatile semiconductor memory device, and a data recovery method.

2. Description of the Related Art

A semiconductor memory device may include a volatile semiconductor memory device and/or a non-volatile semiconductor memory device. A volatile semiconductor memory device may include a dynamic random access memory and/or a static random access memory. A volatile semiconductor memory device is may have a high reading and writing speed, but loses stored contents when external power supply is discontinued. A non-volatile semiconductor memory device may include a mask read-only memory (MROM), a programmable read-only memory (PROM), an erasable programmable read-only memory (EPROM), and/or an electrically erasable programmable read-only memory (EEPROM). A non-volatile semiconductor memory device maintains stored content, even when external power supply is discontinued. Thus, a non-volatile semiconductor memory device may be used to retain contents that must be kept, regardless of whether power is supplied or not.

With MROM, PROM, and EPROM, it may not be easy for general users to update the content of the memory, because erasing and writing is not easily done by a system itself. However, EEPROM is able to electrically erase and write so as to be increasingly applied to system programming or auxiliary memory devices which require continuous update. For example, a flash EEPROM (hereinafter, referred to as a flash memory device) may be advantageous in the application to a high capacity auxiliary memory device, because of its high integration compared to a conventional EEPROM. Of the flash memory devices, a NAND type flash memory may exhibit higher integration, compared to other NOR or AND type flash memory devices.

A flash memory device may store data in a first logic level and a second logic level according to whether electrons are implanted in a floating gate using an F-N (Fowler-Nordheim) tunneling mechanism. However, the retention characteristic of a flash memory device may deteriorate as time passes. That is, the electrons implanted in the floating gate may leak from the floating gate or free electrons may be inserted in the floating gate as time passes. The leakage or insertion of the electrons may cause generation of data errors.

In the case of the electron leakage, an oxide trap or interface trap may decrease by the cycling of program or erase. In this case, because cell current increases a drop of a threshold voltage between source-drain due to the leakage of electrons, a data error may be generated. Also, in the case of electron insertion, because the cell current decreases due to an increase of the threshold voltage between the source-drain as mobile charge is inserted in the floating gate, a data error may be generated.

Figure 1:
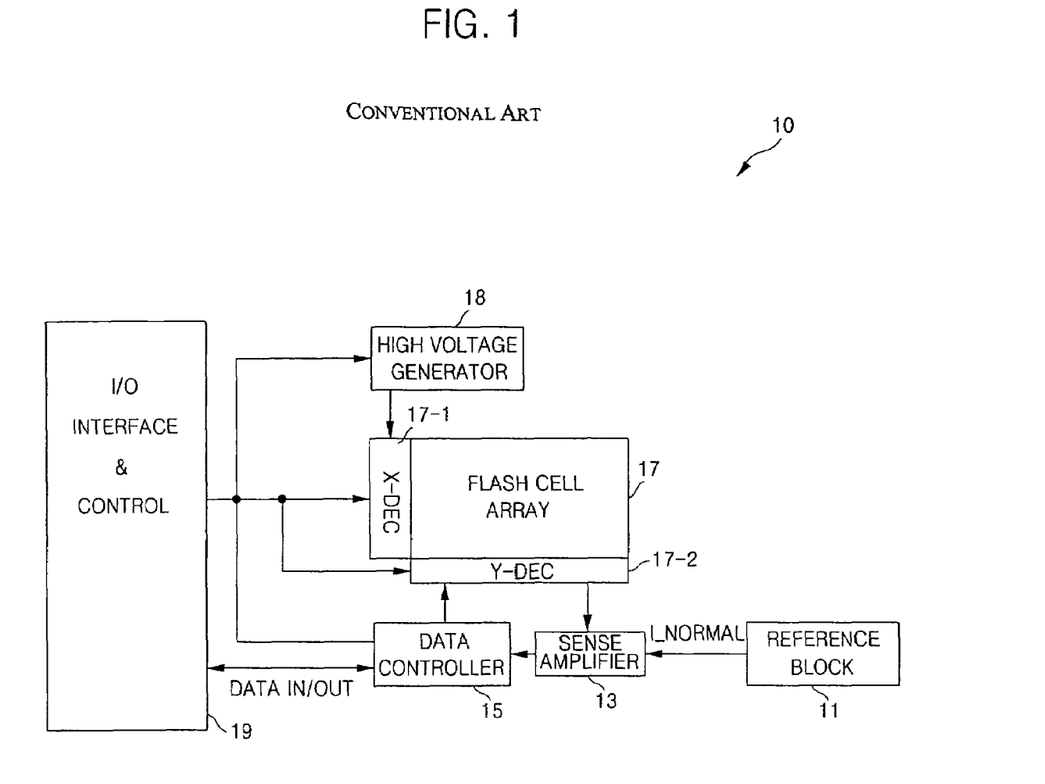
FIG. 1 is a block diagram of a conventional non-volatile semiconductor memory device.

FIG. 1 is a block diagram of a conventional non-volatile semiconductor memory device. Referring to FIG. 1, a non-volatile semiconductor memory device 10 may include a reference current generation block 11, a sense amplifier 13, a data controller 15, a flash memory cell array 17, a row decoder 17-1, a column decoder 17-2, a high voltage generator 18, and an interface/controller 19. To read out data stored in the flash memory cell array 17, when an address received external to the non-volatile semiconductor memory device 10 is input to the row decoder 17-1 and the column decoder 17-2 via the interface/controller 19, the row decoder 17-1 selects a word line of the flash memory cell array 17 based on the address and the column decoder 17-2 selects a bit line of the memory cell array 17 based on the address.

Current output from a memory cell selected by the row decoder 17-1 and the column decoder 17-2 and a reference current output from the reference current generation block 11 are compared by the sense amplifier 13 so as to be divided into a first logic level, for example, "0", and a second logic level, for example, "1". The data whose logic level is determined is output to the interface/controller 19 via the data controller 15. Also, the high voltage generator 18 generates a high voltage needed to program or erase data with respect to the flash memory cell array 17.

However, as data retention capability deteriorates, the current output from the flash memory cell array 17 may decrease below the reference current or increase above the reference current. In either case, when the data stored in the flash memory cell array 17 is read out, a data error may be generated.

SUMMARY

Example embodiments provide a non-volatile semiconductor memory device which may recover data when an error is generated in the data due to the deterioration of a data retention capability of a memory cell, for example, after a relatively long time passage or higher temperature, and a data recovery method.

Example embodiments provide a method and apparatus for recovering data, for example, when a data error is generated by the leakage or insertion of electrons of the floating gate due to the deterioration of the retention capability.

According to example embodiments, a method for recovering data in a non-volatile semiconductor memory device may include controlling reference current by the non-volatile semiconductor memory device, reading data of at least one memory cell based on the controlled reference current, storing the read data in a buffer memory, and/or writing the data stored in the buffer memory to the at least one memory cell.

In example embodiments, controlling the reference current may include receiving a recovery command signal output from a host device, and controlling the reference current upward or downward, in response to the recovery command signal.

In example embodiments, controlling the reference current may include repeatedly controlling the reference current at a time interval.

In example embodiments, reading the data of the at least one memory cell may include comparing the controlled reference current and the cell current output from the at least one memory cell, and determining the data of the at least one memory cell to a predetermined or desired logic level based on a result of the comparison.

In example embodiments, determining the predetermined or desired logic level may include determining the data of the at least one memory cell to be a first logic level when the cell current is greater than the controlled reference current.

In example embodiments, the method further may include erasing data stored in the buffer memory before storing the read data in the buffer memory.

In example embodiments, the method further may include erasing data stored in the at least one memory cell before writing the data stored in the buffer memory to the at least one memory cell.

In example embodiments, the buffer memory and/or at least one memory cell is a flash memory.

According to example embodiments, a non-volatile semiconductor memory device may include a memory cell array, a buffer memory temporarily storing data read from the memory cell array, an interface/controller controlling data to be read, programmed, erased, or recovered with respect to the memory cell array, a reference current generator generating reference current that is controllable in response to a memory recovery signal output from the interface/controller, a sense amplifier reading data of at least one memory cell included in the memory cell array based on the reference current output from the reference current generator, and/or a data controller receiving the read data output from the sense amplifier and selectively outputting the received data to the interface/controller or the buffer memory.

In example embodiments, the reference current generator may include a reference current controller outputting a reference current control signal in response to the memory recovery signal output from the interface/controller, and a reference current generation block receiving the reference current control signal and generating controlled reference current corresponding to the reference current control signal.

In example embodiments, the interface/controller may control the read data received by the data controller to be stored in the buffer memory, data stored in the at least one memory cell to be erased, and data stored in the buffer memory to be programmed in the at least one memory cell.

In example embodiments, the sense amplifier may determine data of the at least one memory cell to a first logic level when the cell current is greater than the controlled reference current.

In example embodiments, the interface/controller repeatedly outputs the memory recovering signal at a predetermined or desired time interval.

In example embodiments, the buffer memory is a flash memory and the interface/controller controls data stored in the buffer memory to be erased and the data read from the sense amplifier to be stored to temporarily store the data output from the data controller.

In example embodiments, the buffer memory is an SRAM (static random access memory).

According to example embodiments, a system having a semiconductor memory may include a host device, and any of the above non-volatile semiconductor memory devices, wherein the non-volatile semiconductor memory device receives a recovery command signal output from the host device and recovers data stored in a memory cell array included in the non-volatile semiconductor memory device in response to the received recovery command signal.

In example embodiments, the host device may output the recovery command signal to the non-volatile semiconductor memory device when an error is generated in the data read from the non-volatile semiconductor memory device.

BRIEF DESCRIPTION OF THE DRAWINGS

Example embodiments will become more apparent by describing them in detail with reference to the attached drawings in which.

DETAILED DESCRIPTION OF EXAMPLE EMBODIMENTS

Example embodiments will now be described more fully hereinafter with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
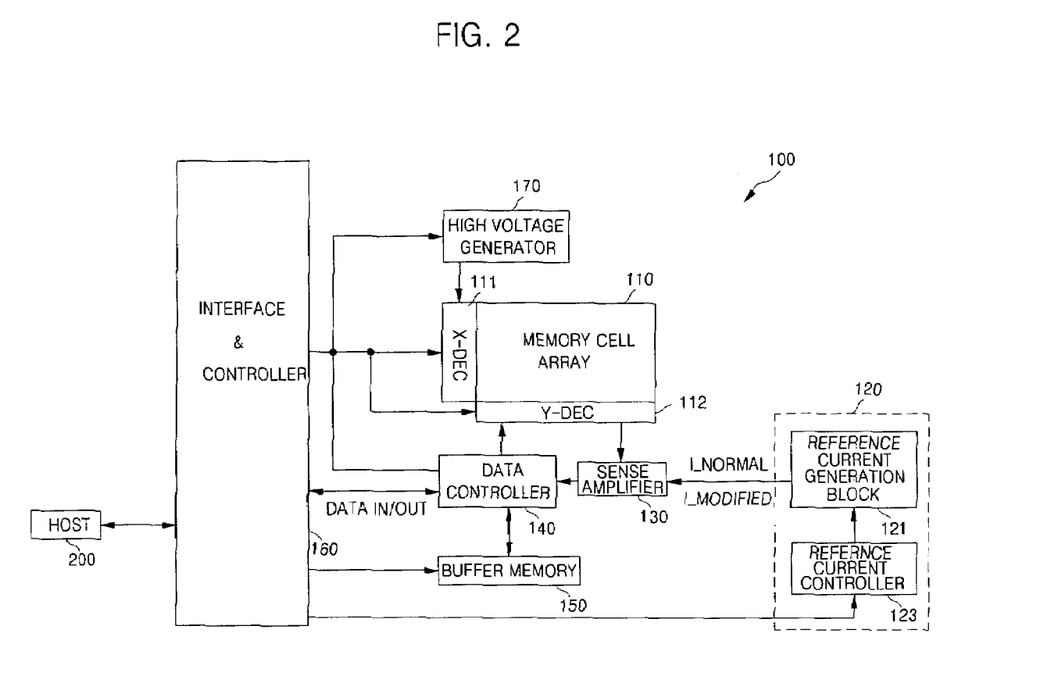
FIG. 2 is a functional block diagram of a non-volatile memory device according to example embodiments.

FIG. 2 is a functional block diagram of a non-volatile memory device according to example embodiments. Referring to FIG. 2, a non-volatile semiconductor memory device 100 according to example embodiments may include a memory cell array 110, a reference current generator 120, a sense amplifier 130, a data controller 140, a buffer memory 150, and/or an interface/controller 160. The non-volatile semiconductor memory device 100 may further include a row decoder 111 and a column decoder 112 to select a memory cell of the memory cell array 110. Also, the non-volatile semiconductor memory device 100 may further include a high voltage generator 170 generating a high voltage needed for programming or erasing data with respect to the memory cell array 110 under the control of the interface/controller 160.

The memory cell array 110 may be embodied by a flash memory cell. The reference current generator 120 may generate reference current that is controllable in response to a memory recovery signal output from the interface/controller 160. The reference current generator 120 may include a reference current controller 123 and a reference current generation block 121. The reference current controller 123 may output a reference current control signal to the reference current generation block 121 in response to the memory recovery signal output from the interface/controller 160. The reference current generation block 121 may receive the reference current control signal and generate reference current controlled corresponding to the received reference current control signal.

Figure 9:
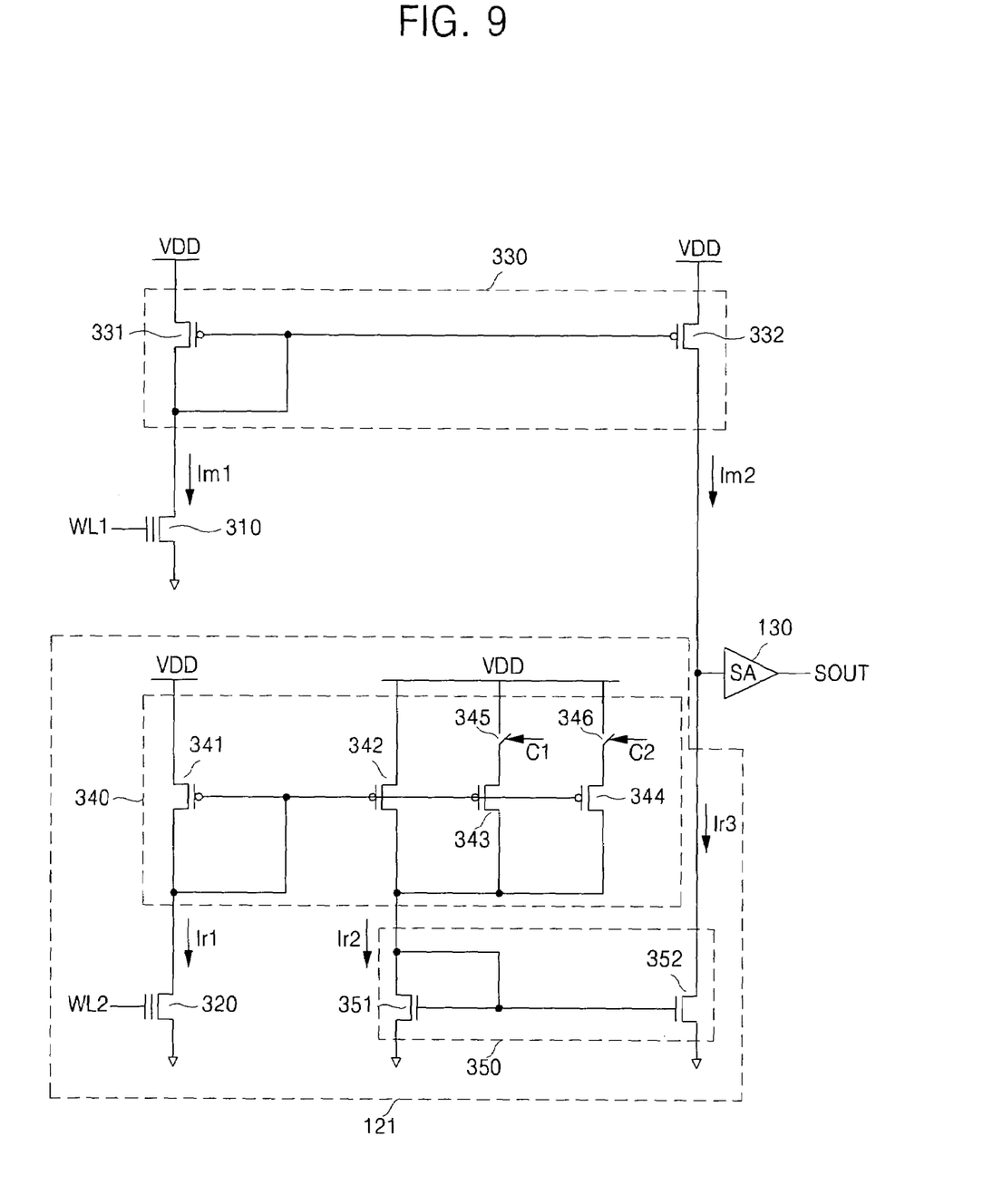
FIG. 9 is a circuit diagram of a reference current generation block according to example embodiments.

FIG. 9 is a circuit diagram of the reference current generation block 121 according to example embodiments. Referring to FIG. 9, the reference current generation block 121 may include a reference cell 320 and first and second current mirror circuits 340 and 350. The first current mirror circuit 340 may include first through fourth PMOS transistors 341, 342, 343, and 344 and first and second switches 345 and 346. Gates of the second through fourth PMOS transistors 342, 343, and 344 are commonly connected to a gate and a drain of the first PMOS transistor 341. The first and second switches 345 and 346 may each be connected between a power supply voltage VDD and the corresponding PMOS transistors, that is, the third and fourth PMOS transistors 343 and 344, respectively, and selectively turned on or off in response to the reference current control signals C1 and C2 output from the reference current controller 123. Thus, the amount of current Ir2 which is a mirrored current of current Ir1 flowing in the reference cell 320 by a first current mirror circuit 340, may vary according to whether the first and/or second switches 345 and 346 are turned on/off.

The second current mirror circuit 350 may include a first and a second NMOS transistors 351 and 352, and generate a reference current Ir3 by mirroring the mirrored current Ir2.

The second current mirror circuit 350, like the first current mirror circuit 340, may include a plurality of transistors and a switch that is selectively turned on/off in response to the reference current control signal. Thus, by controlling the amount of current mirrored by the first current mirror circuit 340 and/or second current mirror circuit 350, the amount of the reference current Ir2 may be controlled to be, for example, k times, where k is an arbitrary real number of the amount of current Ir1 flowing in the reference cell.

The cell current Im1 of a memory cell 310, as shown in FIG. 9, may be mirrored by a current mirror 330 and the mirrored cell current Im2 may be input to the sense amplifier 130. The current mirror 330 may include PMOS transistors 331 and 332.

The circuit shown in FIG. 9 is an example of the reference current generation block 121 and the reference current generation block shown in FIG. 9 may be variously modified. Also, the reference current generation block 121 may be embodied to control the reference current in a form other than a current mirror form. That is, the above-described method is merely an example and the reference current generation block 121 only needs to be able to generate reference current and control the generated reference current upward or downward.

The sense amplifier 130 may read the data of at least one memory cell included in the memory cell array 110 based on the reference current output from the reference current generator 120. That is, the sense amplifier 130 may receive cell current output from at least one memory cell included in the memory cell array 110, which may signify the mirrored cell current, and the reference current output from the reference current generator 120 and classify the data of the memory cell into a first logic level, for example, data "0", and a second logic level, for example, data "1", based on the cell current and the reference current. For example, the sense amplifier 130 may determine the data of the memory cell to be the second logic level, for example, data "1", when the cell current is greater than the reference current output from the reference current generator 120.

The data controller 140 may receive the read data output from the sense amplifier 130 and selectively output the received data to the interface/controller 160 or the buffer memory 150. That is, when a normal data read operation is performed, the data controller 140 outputs the read data to the interface/controller 160. When a memory recovery operation is performed, the data controller 140 outputs the read data to the buffer memory 150. The buffer memory 150 may receive data read from the memory cell array 110 via the data controller 140 and temporarily store the received data. The buffer memory 150 may be embodied by a flash memory or SRAM (static random access memory) that may temporarily store the data received via the data controller 140. However, example embodiments are not limited thereto. Also, when the non-volatile semiconductor memory device 100 is provided with a storage device, for example, a page buffer, the storage device may be used as the buffer memory 150.

The interface/controller 160 may control at least one of the above-described devices, that is, the reference current generator 120, the sense amplifier 130, the data controller 140, and/or the buffer memory 150, to read, program, erase, and/or recover the data with respect to the memory cell array 110. Also, the interface/controller 160 may be controlled to store the read data that the data controller 140 received in the buffer memory 150, erase the data stored in the memory cell, and program the data stored in the buffer memory 150 in the memory cell. That is, when a data error is generated or regularly at a predetermined or desired time interval, the interface/controller 160 may output a memory recovery signal to the reference current generator 120.

The reference current generator 120 in response to the memory recovery signal may control the reference current upward or downward by a predetermined or desired current amount so that the data where an error is generated can be correctly read out. The sense amplifier 130 may read the memory cell based on the controlled reference current to read out data at a correct value. Thus, the interface/controller 160 may perform control such that the correctly read data value is stored in the buffer memory 150 via the data controller 140. Also, the interface/controller 160 may recover the original data by controlling an erase of the data stored in the memory cell and newly program the data stored in the buffer memory 150 in the memory cell.

As described above, the interface/controller 160 may output the memory recover signal to the reference current generator 120 by repeating the signal at a predetermined or desired time interval or output the memory recover signal in response to a memory recovery command of a host device 200.

Figure 3:
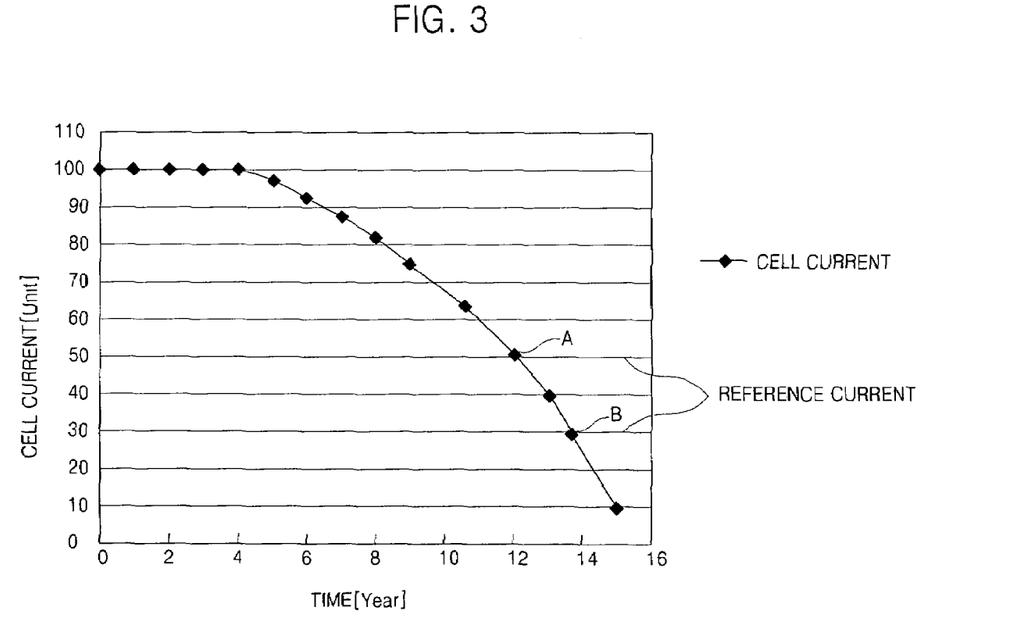
FIG. 3 is an example graph showing a decrease in the cell current according to the time passage of a non-volatile memory device.

FIG. 3 is a graph showing a decrease in the cell current according to the time passage of a non-volatile memory device. In FIG. 3, the cell current of data "1", the cell current of data "0", and the initially set reference current are respectively indicated as 100, 0, and 50.

Referring to FIGS. 2 and 3, in a method for recovering data in a memory according to example embodiments, the sense amplifier 130 reads out the data of the memory cell to be "1" when the cell current output from the memory cell in the memory cell array 110 is greater than the reference current. That is, as shown in FIG. 2, data can be correctly read out until a point "A" even when the data retention capability has deteriorated to some degree.

However, when the data retention capability is deteriorated to a point "B", because the cell current of the memory cell is less than the reference current, the data of the memory cell is read out as "0" so that a data error is generated. When the data error is generated, the interface/controller 160 may output the memory recovery signal to the reference current generator 120.

The reference current generator 120 may control the reference current downwardly, for example, down to 30, in response to the memory recovery signal. When the sense amplifier 130 again reads out the data of the memory cell based on the down controlled reference current, that is, 30, because the current of the memory cell is greater than the down controlled reference current when the data is read out at the point "B", data is read out to be "1".

The data correctly read out based on the down controlled reference current is stored in the buffer memory 150 via the data controller 140. Then, when the data stored in the buffer memory 150 is programmed in the memory cell, the data where data retention is not deteriorated, that is, data "1" where the cell current is 100, is stored.

The graph of FIG. 3 shows a case in which the cell current is decreased as the threshold current is increased when mobile charge is inserted in the floating gate of the memory cell. When the cell current is decreased, as described above, the reference current generator 120 may control the reference current downwardly. However, when the electrons implanted in the floating gate of the memory cell leak, that is, the cell current increases as the threshold voltage is decreased, contrary to the above description, an error may be generated, that is, data is read to be "1" although the original data is "0". Accordingly, when the cell current is increased, the reference current generator 120 may control the reference current upwardly.

Figure 4:
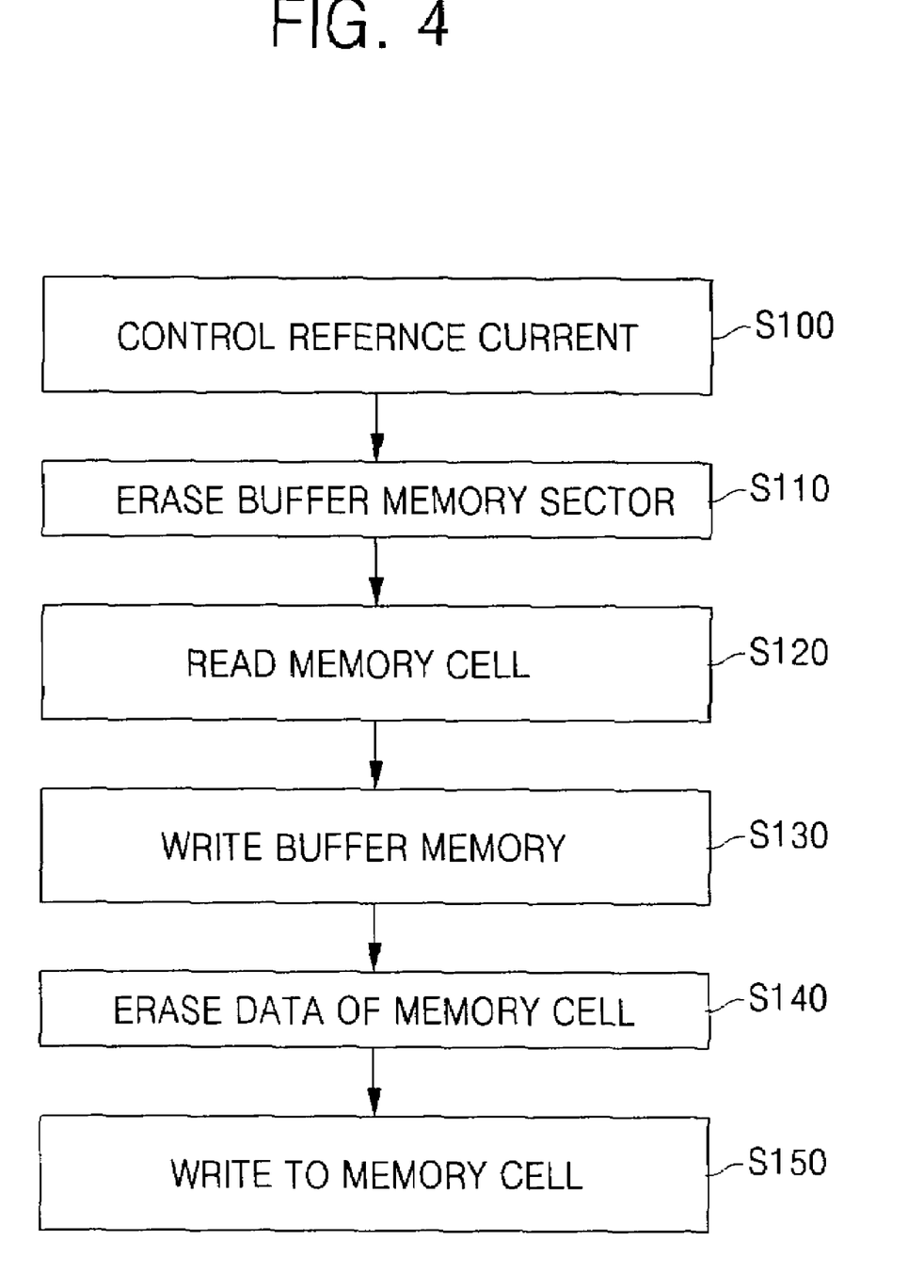
FIG. 4 is a flow chart for explaining a method for recovering data in a non-volatile memory device according to example embodiments.

FIG. 4 is a flow chart for explaining a method for recovering data in a non-volatile memory device according to example embodiments. Referring to FIGS. 2 and 4, in a method for recovering data in a memory according to example embodiments, the reference current generator 120 may control the reference current (S100). The reference current generator 120 may control the reference current in response to the memory recovery signal output from the interface/controller 160.

The interface/controller 160 may output the memory recovery signal when an error is generated during the operation of reading the memory or regularly repeats output of the memory recovery signal at a predetermined or desired time interval. When the memory recovery signal is repeatedly output, data retention, for example, the insertion of electrons as shown in FIG. 3, may be deteriorated somewhat, but deterioration is not too much to cause an error, for example, the point "A" of FIG. 3, the data can be recovered to the initial state in which the data retention capability is not deteriorated so that the frequency of generation of data errors may be reduced.

The sense amplifier 130 may read the data of the memory cell included in the memory cell array 110 based on the controlled reference current (S120). The interface/controller 160 may control the read data to be stored in the buffer memory 150 via the data controller 140 (S130). The buffer memory 150 may be embodied by an SRAM or a flash memory. When the buffer memory 150 is a flash memory, an operation to erase the data stored in the buffer memory 150 may be further performed before the read data is stored in the buffer memory 150 via the data controller 140 (S110).

Also, the interface/controller 160 may control the data stored in the buffer memory 150 to be written to the memory cell (S150). When the memory cell array 110 is a flash memory device, erasing the data stored in the memory cell (S140) may also be performed.

Figure 5:
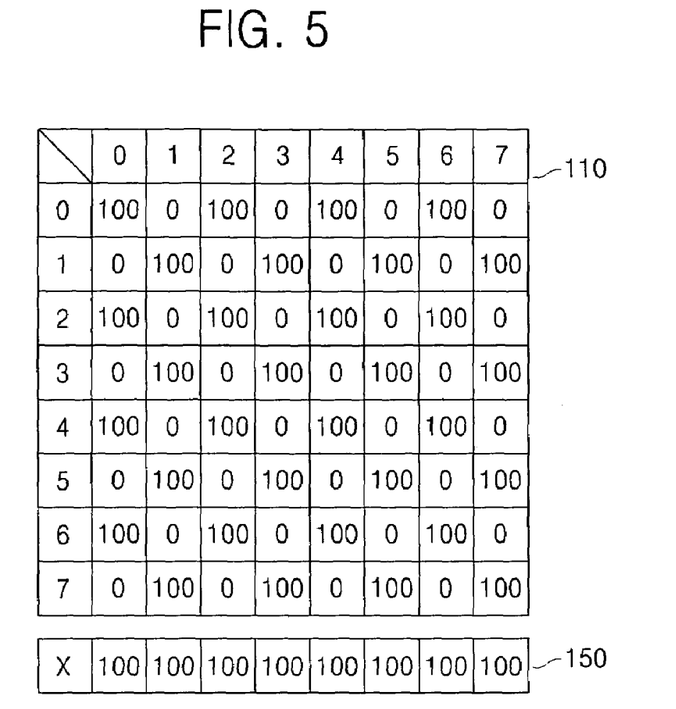
FIG. 5 is a conceptual view illustrating a memory cell of the non-volatile memory device according to example embodiments.

FIGS. 5 through 8 show the process in which a memory cell array changes according to a method for recovering data in a non-volatile semiconductor memory device according to example embodiments. FIG. 5 shows the data initially stored in the memory cell array 110 by a ratio value of the current amount corresponding thereto. For the data "1" and data "0", cell current are 100 and 0, respectively. Also, the initial reference current is assumed to be 50. The memory cell 150 indicates the buffer memory. That is, FIG. 5 conceptually shows a case in which the data "1" and "0" are repeatedly stored in the memory cell array.

Figure 6:
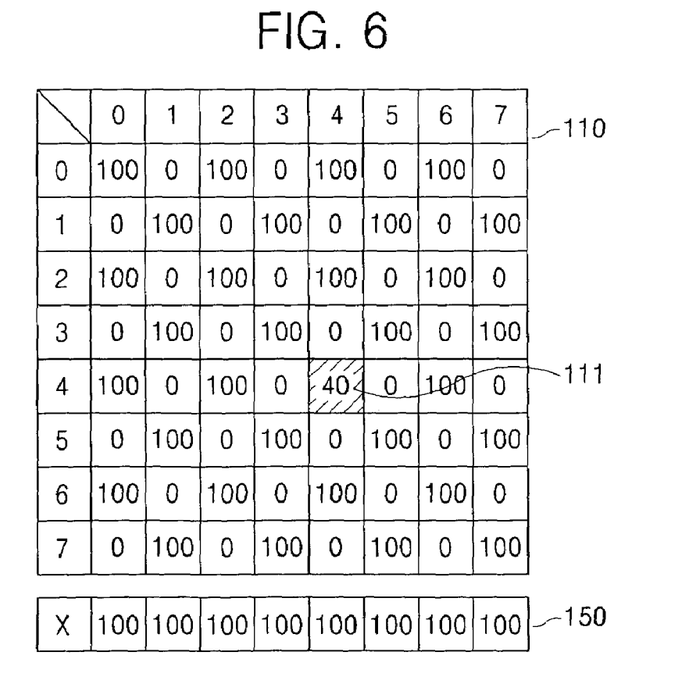
FIG. 6 is a conceptual view illustrating a memory cell, where an error is generated, of the non-volatile memory device according to example embodiments.

FIG. 6 is a conceptual view illustrating a memory cell, where an error is generated, of the non-volatile memory device according to example embodiments. Referring to FIG. 6, a cell current decrease is generated in a memory cell 111 included in the memory cell array 110. Because the initial reference current is assumed to be 50, when the data of the memory cell 111 is read out, the data becomes "0". However, as shown in FIG. 5, since the original data value of the memory cell 111 is "1", an error is generated.

Figure 7:
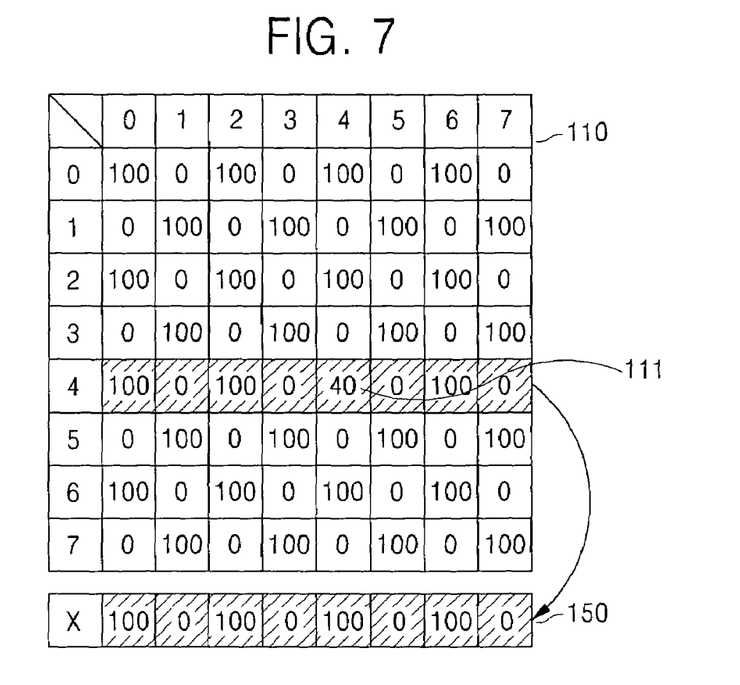
FIG. 7 is a conceptual view illustrating a process of recovering data of the memory cell of FIG. 6 according to a data recovery method according to example embodiments.

FIG. 7 is a conceptual view illustrating a process of recovering data of the memory cell of FIG. 6 according to a data recovery method according to example embodiments. Referring to FIG. 7, after the reference current is controlled down to 30, the data of the fourth row is read out and the read data is stored in the buffer memory 150 as shown in FIG. 7. That is, although the cell current of the memory cell 111 is 40, because the controlled reference current is 30, the data "1" is read from the memory cell 111. When the read data "1" is stored in the buffer memory 150, the cell current value becomes 100 again.

Figure 8:
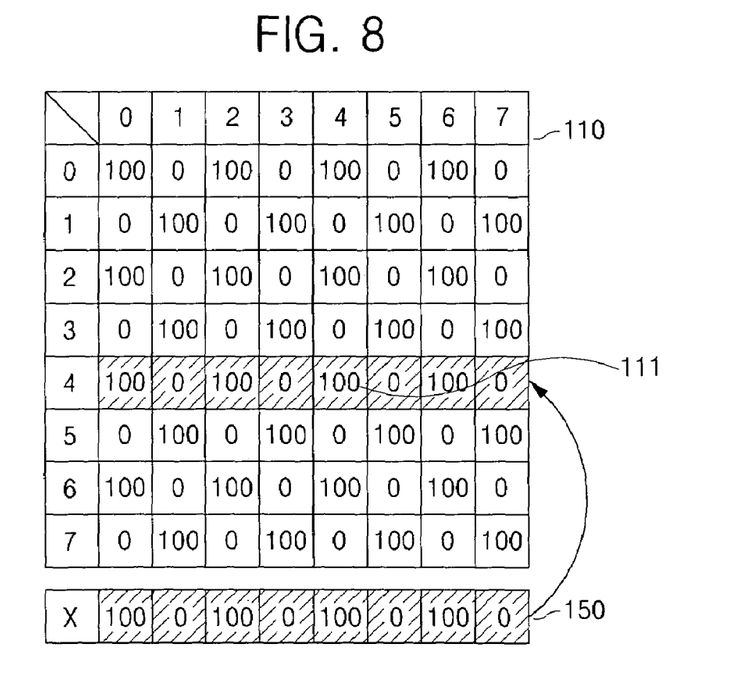
FIG. 8 is a conceptual view illustrating the data of a recovered memory cell according to the data recovery method according to example embodiments.

FIG. 8 is a conceptual view illustrating the data of a recovered memory cell according to the data recovery method according to example embodiments. Referring to FIG. 8, the data stored in the buffer memory 150 is written to the fourth row and consequently the memory cell array 110 is recovered with the initial data of the memory cell array 110 shown in FIG. 5.

As described above, the method for recovering data in a non-volatile semiconductor memory device according to example embodiments may recover the data where an error is generated due to the deterioration of the data retention capability of the memory cell. Thus, the original information may be recovered so that the reliability of a product is improved.

While example embodiments have been particularly shown and described with reference to the above, it will be understood by those skilled in the art that various changes in form and details may be made therein without departing from the spirit and scope of the appended claims.

What is claimed is:

1. A method for recovering data in a non-volatile semiconductor memory device, the method comprising:
   controlling a reference current by the non-volatile semiconductor memory device in response to a recovery command signal output from a host device:
   reading data of at least one memory cell based on the controlled reference current;
   storing the read data in a buffer memory; and
   writing the data stored in the buffer memory to the at least one memory cell.

2. The method of claim 1, wherein controlling the reference current further includes:
   adjusting the reference current upward or downward in response to the recovery command signal.

3. The method of claim 1, wherein controlling the reference current includes repeatedly controlling the reference current at a time interval.

4. The method of claim 1, wherein reading data of the at least one memory cell includes:
   comparing the controlled reference current and a cell current output from the at least one memory cell; and
   determining a logic level of data of the at least one memory cell based on a result of the comparison.

5. The method of claim 4, wherein determining the logic level includes determining the data of the at least one memory cell to be a first logic level when the cell current is greater than the controlled reference current.

6. The method of claim 1, further comprising:
   erasing data stored in the buffer memory before storing the read data in the buffer memory.

7. The method of claim 1, further comprising:
   erasing data stored in the at least one memory cell before writing the data stored in the buffer memory to the at least one memory cell.

8. The method of claim 6, wherein at least one of the buffer memory and the at least one memory cell is a flash memory.

9. The method of claim 7, wherein at least one of the buffer memory and the at least one memory cell is a flash memory.

10. A non-volatile semiconductor memory device comprising:
    a memory cell array;
    a buffer memory temporarily storing data read from the memory cell array;
    an interface/controller controlling data to be read, programmed, erased, or recovered with respect to the memory cell array;
    a reference current generator generating a reference current that is controllable in response to a memory recovery signal output from the interface/controller;
    a sense amplifier reading data of at least one memory cell included in the memory cell array based on the reference current output from the reference current generator; and
    a data controller receiving the read data output from the sense amplifier and selectively outputting the received data to the interface/controller or the buffer memory.

11. The non-volatile semiconductor memory device of claim 10, wherein the reference current generator comprises:
    a reference current controller outputting a reference current control signal in response to the memory recovery signal output from the interface/controller; and
    a reference current generation block receiving the reference current control signal and generating a controlled reference current corresponding to the reference current control signal.

12. The non-volatile semiconductor memory device of claim 10, wherein the interface/controller controls at least one of the read data received by the data controller to be stored in the buffer memory, data stored in the at least one memory cell to be erased, and data stored in the buffer memory to be programmed in the at least one memory cell.

13. The non-volatile semiconductor memory device of claim 11, wherein the sense amplifier determines data of the at least one memory cell to be a first logic level when the cell current is greater than the controlled reference current.

14. The non-volatile semiconductor memory device of claim 10, wherein the interface/controller repeatedly outputs the memory recovering signal at a time interval.

15. The non-volatile semiconductor memory device of claim 10, wherein the buffer memory is a flash memory and the interface/controller controls data stored in the buffer memory to be erased and the data read from the sense amplifier to be stored to temporarily store the data output from the data controller.

16. The non-volatile semiconductor memory device of claim 10, wherein the buffer memory is an SRAM (static random access memory).

17. A system, comprising:
a host device; and
a non-volatile semiconductor memory device according to claim 10,
wherein the non-volatile semiconductor memory device receives a recovery command signal output from the host device and recovers data stored in the memory cell array in response to the received recovery command signal.

18. The system of claim 17, wherein the host device outputs the recovery command signal to the non-volatile semiconductor memory device when an error is generated in the data read from the non-volatile semiconductor memory device.

* * * * *